(12) United States Patent
Yamaguchi

(10) Patent No.: US 10,874,019 B2
(45) Date of Patent: Dec. 22, 2020

(54) DISPLAY DEVICE

(71) Applicant: Japan Display Inc., Tokyo (JP)

(72) Inventor: Satoru Yamaguchi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/582,741

(22) Filed: Sep. 25, 2019

(65) Prior Publication Data

US 2020/0100362 A1 Mar. 26, 2020

(30) Foreign Application Priority Data

Sep. 26, 2018 (JP) .................................. 2018-180836

(51) Int. Cl.
| | |
|---|---|
| H05K 1/14 | (2006.01) |
| H05K 5/00 | (2006.01) |
| G02F 1/1333 | (2006.01) |
| H05K 9/00 | (2006.01) |
| H05K 5/03 | (2006.01) |

(52) U.S. Cl.
CPC ....... *H05K 1/147* (2013.01); *G02F 1/133308* (2013.01); *H05K 5/0017* (2013.01); *G02F 2001/13332* (2013.01); *G02F 2001/133314* (2013.01); *G02F 2001/133331* (2013.01); *G02F 2001/133334* (2013.01); *H05K 5/03* (2013.01); *H05K 9/0054* (2013.01); *H05K 2201/10128* (2013.01)

(58) Field of Classification Search
CPC .. H05K 1/00; H05K 1/02; H05K 1/14; H05K 1/18; H05K 3/36; G02F 1/13; G02F 1/133; G02F 1/1333; G02F 1/13357; G02F 1/13345; G09F 19/00; G09F 19/04

USPC .......... 361/75–778, 784, 803; 174/254–260; 349/149–151
See application file for complete search history.

(56) References Cited

U.S. PATENT DOCUMENTS

| | | | |
|---|---|---|---|
| 7,580,103 B2* | 8/2009 | Kawaguchi ....... | G02F 1/133308 349/110 |
| 9,148,951 B2* | 9/2015 | Kim ..................... | H05K 1/0259 |
| 2011/0102726 A1* | 5/2011 | Nobeoka ............. | G02F 1/13306 349/150 |
| 2011/0187965 A1* | 8/2011 | Ooishi ..................... | H05K 1/00 349/62 |
| 2012/0051089 A1* | 3/2012 | Park ..................... | G02B 6/0086 362/611 |

(Continued)

FOREIGN PATENT DOCUMENTS

JP  2016-197189  11/2016

*Primary Examiner* — Tuan T Dinh
(74) *Attorney, Agent, or Firm* — K&L Gates LLP

(57) ABSTRACT

According to an aspect, a display device includes: a plate member disposed on a back-surface side of a display unit; a printed circuit board disposed on a back-surface side of the plate member; a flexible printed circuit board that is inserted in a through-hole passing through the plate member and electrically couples the display unit to the printed circuit board; a first tape that is attached to an inside of the through-hole and to a portion of the plate member at a periphery of the through-hole and is disposed between the plate member and the flexible printed circuit board; and a second tape that is attached to the back-surface side of the plate member and to the flexible printed circuit board to close the through-hole. The second tape has a hole through which part of the first tape is exposed.

4 Claims, 4 Drawing Sheets

(56) References Cited

U.S. PATENT DOCUMENTS

2014/0202055 A1* 7/2014 Nozue ................ G09F 15/0012
                                                    40/700
2014/0307396 A1* 10/2014 Lee ...................... H05K 1/028
                                                    361/749

* cited by examiner

DISPLAY DEVICE

CROSS-REFERENCE TO RELATED APPLICATIONS

This application claims priority from Japanese Application No. 2018-180836, filed on Sep. 26, 2018, the contents of which are incorporated by reference herein in its entirety.

BACKGROUND

1. Technical Field

The present disclosure relates to an electronic apparatus including a flexible printed circuit board that electrically couples a display unit to a printed circuit board, and relates to, for example, a display device.

2. Description of the Related Art

An electronic apparatus such as a display device disclosed in Japanese Patent Application Laid-open Publication No. 2016-197189 includes a flexible printed circuit board that electrically couples a display unit to a printed circuit board. The flexible printed circuit board is inserted in a through-hole that passes through a housing of the display unit. In the electronic apparatus, a tape is attached to an inner perimeter portion of the through-hole so that the flexible printed circuit board will not be damaged. In the electronic apparatus, a second tape is attached to the housing to fix the flexible printed circuit board to the housing and to close the through-hole.

In checking the electronic apparatus, it is difficult for an inspector to check, after the second tape is attached, whether the tape for protecting the flexible printed circuit board from damage is attached.

SUMMARY

According to an aspect, a display device includes: a plate member disposed on a back-surface side of a display unit; a printed circuit board disposed on a back-surface side of the plate member; a flexible printed circuit board that is inserted in a through-hole passing through the plate member and electrically couples the display unit to the printed circuit board; a first tape that is attached to an inside of the through-hole and to a portion of the plate member at a periphery of the through-hole and is disposed between the plate member and the flexible printed circuit board; and a second tape that is attached to the back-surface side of the plate member and to the flexible printed circuit board to close the through-hole. The second tape has a hole through which part of the first tape is exposed.

DETAILED DESCRIPTION

An embodiment of the present disclosure will be described with reference to the accompanying drawings. The embodiment described below is not intended to limit the scope of the present disclosure. The elements described below include elements that can be easily thought of by those skilled in the art or elements that are substantially the same. The elements described below can be combined as appropriate. The embodiment of the present disclosure is presented for illustrative purposes only. Any modifications that are easily thought of by those skilled in the art may be made as appropriate within the scope of the present disclosure, and the modifications indeed fall within the scope of the present disclosure. For ease of discussion, the width, the thickness, the shape, and other dimensions of the components may be schematically illustrated in some drawings compared to the actual structure, but the drawings are given for illustrative purposes only and are not intended to limit the scope of the present disclosure. In the present description and the accompanying drawings, elements similar to those described with reference to a previously mentioned drawing are similarly numbered and the description thereof may be omitted as appropriate.

In this disclosure, when an element is described as being "on" another element, the element can be directly on the other element, or there can be one or more elements between the element and the other element.

Figure 1:
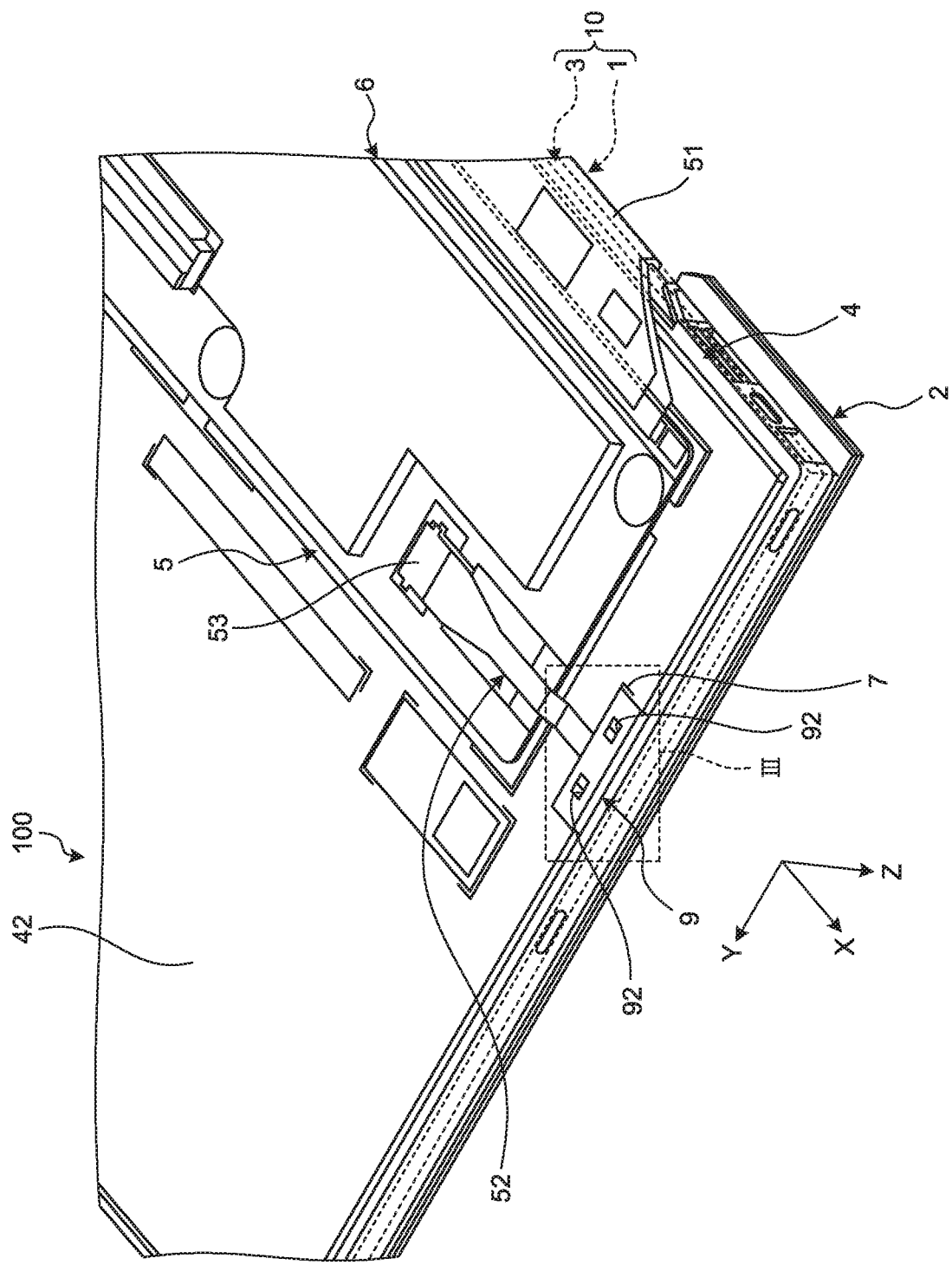
FIG. 1 is a perspective view of main components of a display device according to an embodiment of the present disclosure illustrating a mount state of a printed circuit board on a back plate of the display device.

A display device 100 illustrated in FIG. 1 is mounted on, for example, a dashboard of a vehicle, and used for navigation display of a vehicle navigation system, display of a music operation screen, display of playing movies, or instrument display, for example, display of speed. The display device 100 includes a front case 2, a display unit 10, a backlight unit 3 serving as a light source, a back plate 4 that is a plate member, a printed circuit board 5, and a shielding cover 6. The display unit 10 performs at least one of navigation display, a display of music operation screen, display of playing movies, and display of measuring instruments such as a speed meter.

In a first embodiment of the present disclosure, the display unit 10 includes a display panel 1 that is a liquid crystal display panel including two optically transmissive substrates and a liquid crystal sealed between the two optically transmissive substrates. The display panel 1 displays images by changing the light transmittance in each pixel in accordance with image signals. A direction in the plane of the display panel 1 is referred to as an X-direction and a direction in the plane of the display panel 1 orthogonal to the X-direction is referred to as a Y-direction. A direction orthogonal to the X-Y plane is referred to as a Z-direction. When viewed in the Z-direction, a side at which a display surface (or an upper surface) of the display panel 1 is disposed is referred to as a display-surface side (or an upper-surface side). The display panel 1 displays an image on the display surface. A side at which a back surface (or a lower surface) of the display panel 1 is disposed is referred to as a back-surface side (or a lower-surface side). The back surface is opposite to the display surface (or the upper surface) in the Z-direction.

An end of a flexible printed circuit (hereinafter, called "FPC") board 51 is coupled to the display panel 1. The other end of the FPC board 51 is coupled to the printed circuit board 5. The printed circuit board 5 transmits control signals to the display panel 1 to control the display operations of the display panel 1. A protective cover may be provided on the display side of the display panel 1. The protective cover is an optically transmissive member covering the display surface of the display panel 1 to protect it. Examples of the optically transmissive member include, but are not limited to, a glass, an optically transmissive resin member, a touch panel, etc.

The backlight unit 3 serving as a light source of the display unit 10 is disposed at a rear surface side of the display panel 1 (a side of a back surface of the display panel 1 opposite to the surface in the Z-direction on which the display panel 1 displays an image). The backlight unit 3 emits light to the display panel 1 to irradiate the entire surface of a display region with light. The backlight unit 3 includes a backlight main body including light-emitting elements such as light emitting diodes and including a light guide that guides light from the light-emitting elements to output the light toward the rear surface of the display panel 1. The backlight unit 3 includes a plurality of bosses protruding from a back-surface side of the backlight main body. A threaded hole is formed on the back surface of the bosses.

The front case 2 and the back plate 4 are assembled to form a housing. The front case 2 and the back plate 4 define an inner space in which the display panel 1 and the backlight unit 3 are accommodated.

The back plate 4 is disposed on a back-surface side of the backlight unit 3 of the display unit 10. The back plate 4 is formed by bending a metal plate member.

The printed circuit board 5 is disposed on a back-surface side of the back plate 4. The printed circuit board 5 includes electronic components (not illustrated). An insulating resin film is laminated on a surface of the printed circuit board 5.

Figure 2:
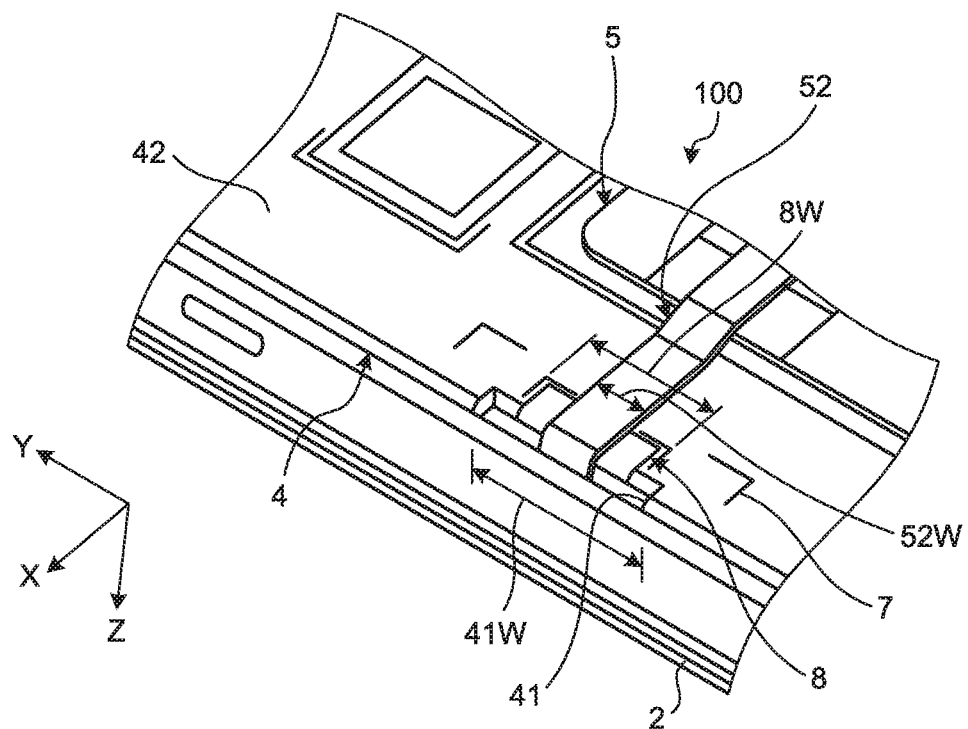
FIG. 2 is a perspective view illustrating a state before a second tape illustrated in FIG. 1 is attached.

An end of an FPC board 52 illustrated in FIGS. 1 and 2 is coupled to the printed circuit board 5. FIG. 1 is a perspective view of main components of the display device according to the first embodiment illustrating a mount state of the printed circuit board on the back plate of the display device. FIG. 2 is a perspective view illustrating a state before a second tape illustrated in FIG. 1 is attached.

The end of the FPC board 52 is coupled to the printed circuit board 5 via a connector 53 illustrated in FIG. 1. As illustrated in FIG. 2, the FPC board 52 is inserted in a through-hole 41 passing through the back plate 4 and is guided into the housing. The other end of the FPC board 52 is coupled to the light-emitting elements of the backlight unit 3. The FPC board 52 electrically couples the backlight unit 3 of the display unit 10 to the printed circuit board 5. In the first embodiment, the through-hole 41 opens at the back-surface side of the back plate 4 and is disposed at an edge of the back plate 4 in the X-direction. As illustrated in FIG. 2, a width 41W of the through-hole 41 in the Y-direction is greater than a width 52W of the FPC board 52 in the Y-direction.

The shielding cover 6 is provided to shield the electronic components mounted on the printed circuit board 5. In the first embodiment, the FPC board 52 is not covered with the shielding cover 6 and is exposed to the back-surface side of the back plate 4.

The display device 100 is assembled such that the display panel 1 and the backlight unit 3 are disposed in the inner space between the front case 2 and the back plate 4 and then the front case 2 and the back plate 4 are assembled, and the printed circuit board 5 and the shielding cover 6 are mounted on the back-surface side of the back plate 4 in this order.

Figure 3:
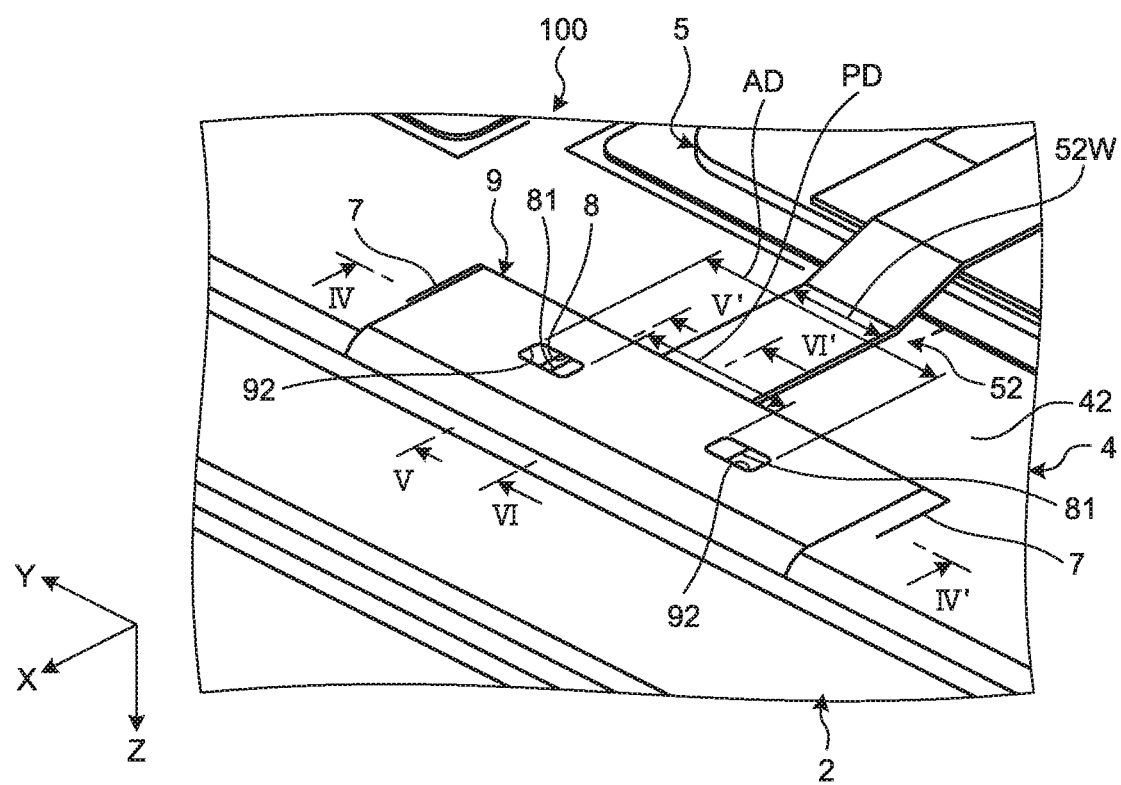
FIG. 3 is an enlarged perspective view of part III in FIG. 1.
Figure 4:
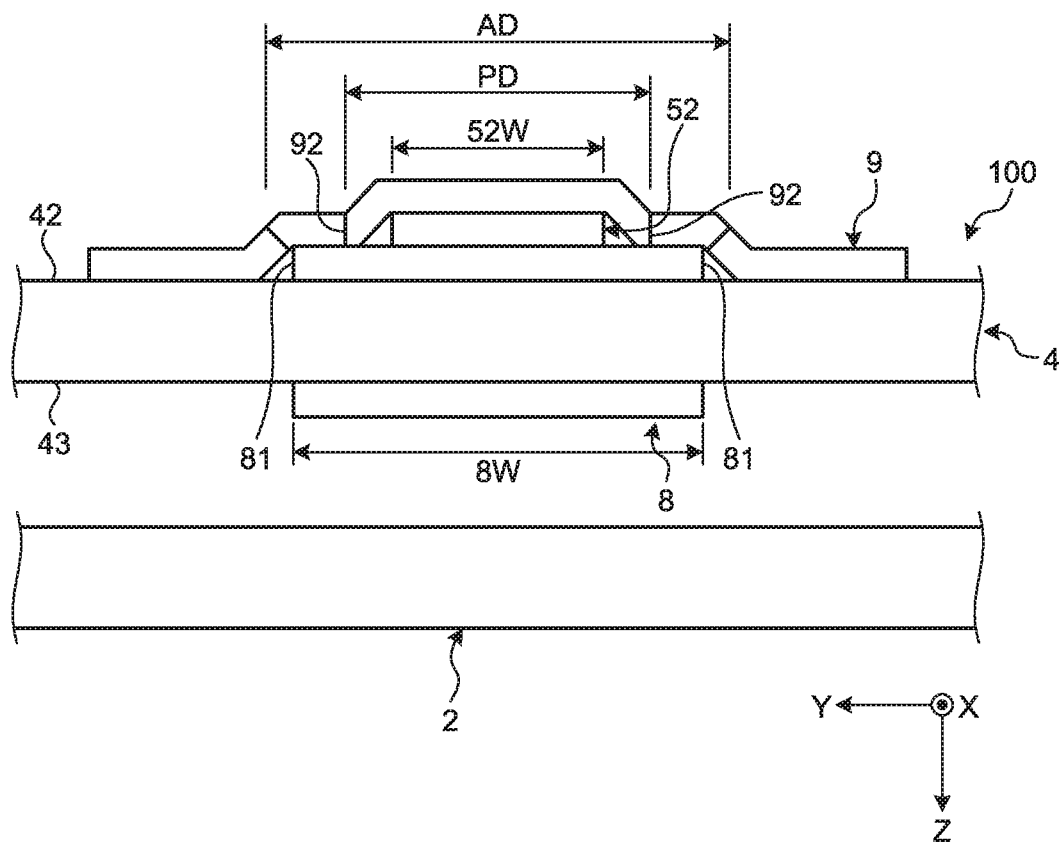
FIG. 4 is a schematic partial sectional view taken along line IV-IV' in FIG. 3.
Figure 5:
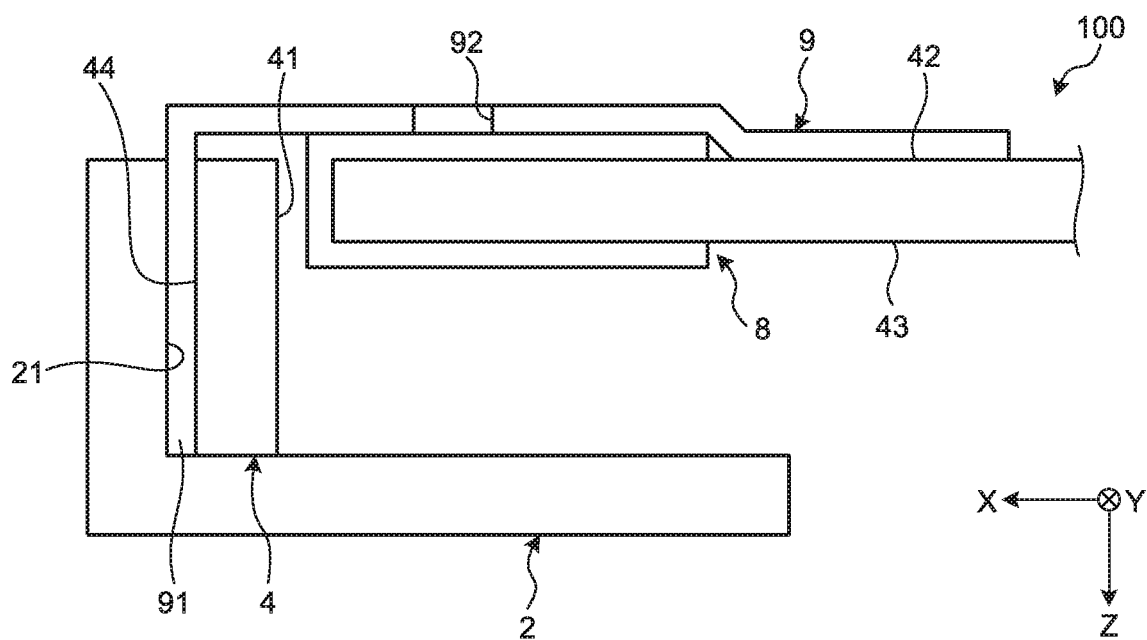
FIG. 5 is a schematic partial sectional view taken along line V-V' in FIG. 3.
Figure 6:
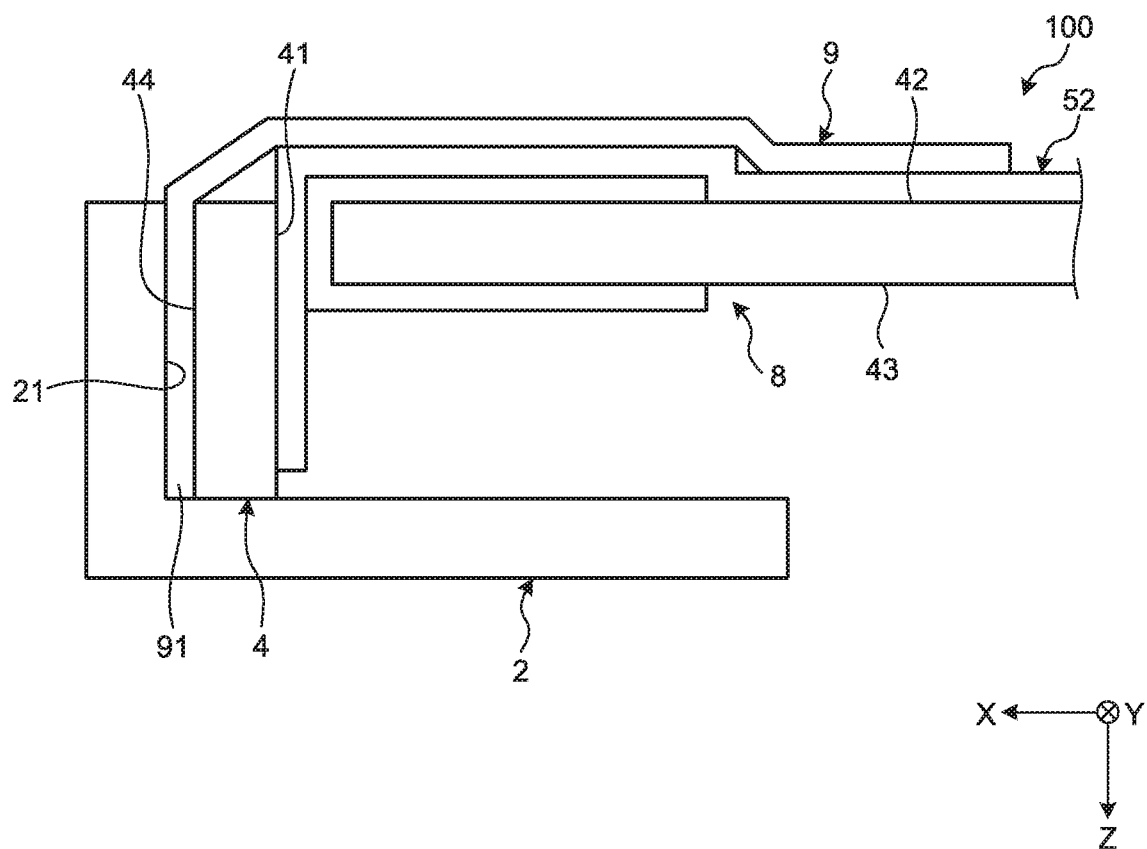
FIG. 6 is a schematic partial sectional view taken along line VI-VI' in FIG. 3.

Described next is a structure for fixing the FPC board 52 to the back plate 4. FIG. 3 is an enlarged perspective view of part III in FIG. 1. FIG. 4 is a schematic partial sectional view taken along line IV-IV' in FIG. 3. FIG. 5 is a schematic partial sectional view taken along line V-V' in FIG. 3. FIG. 6 is a schematic partial sectional view taken along line VI-VI' in FIG. 3.

As illustrated in FIGS. 3, 4, 5, and 6, the display device 100 includes a first tape 8 and a second tape 9 to fix the FPC board 52 to the back plate 4. The first tape 8 and the second tape 9 each include a substrate made of synthetic resin and an adhesive layer laminated on the substrate and having adhesiveness.

As illustrated in FIGS. 4, 5, and 6, the first tape 8 is inserted in the through-hole 41 of the back plate 4 and attached to the through-hole 41 and both surfaces 42 and 43 of the back plate 4. The first tape 8 is attached to an inside of the through-hole 41 and to a portion located at the periphery of the through-hole 41 of the surface 42 on the back-surface side of the back plate 4 and overlapping the FPC board 52. The first tape 8 is disposed between the surface 42 of the back plate 4 and the FPC board 52. As illustrated in FIG. 2, the first tape 8 is attached to a center portion of the through-hole 41 in the Y-direction on the surfaces 42 and 43. A width 8W of the first tape 8 in the Y-direction is greater than the width 52W of the FPC board 52 in the Y-direction.

As illustrated in FIGS. 3, 5, and 6, the second tape 9 is attached to the surface 42 of the back plate 4 and to the FPC board 52 to close the through-hole 41 and to fix the FPC board 52 to the back plate 4. As illustrated in FIGS. 5 and 6, a portion 91 of the second tape 9 is attached to an outer surface 44 of the back plate 4 and is disposed between the outer surface 44 of the back plate 4 and an inner surface 21 of the front case 2.

The second tape 9 has holes 92 for exposing part of the first tape 8. The holes 92 pass through the second tape 9. In the first embodiment, the holes 92 have a rectangular shape with its longitudinal direction being parallel to the Y-direction. The holes 92 are two holes that are spaced apart in the Y-direction. The two holes 92 are disposed at positions at which the holes 92 can expose both edges 81 of the first tape 8 in the Y-direction. When the second tape 9 is attached to fix the FPC board 52 to the back plate 4, a distance PD between closest perimeter portions of the two holes 92 is less than the width 8W of the first tape 8 in the Y-direction as illustrated in FIG. 4. A distance AD between furthest perimeter portions of the two holes 92 is greater than the width 8W of the first tape 8 in the Y-direction as illustrated in FIG. 4. The display device 100 has a mark 7 on the surface 42 of the back plate 4. The mark 7 indicates a position of the second tape 9 at which the two holes 92 can expose the edges 81 of the first tape 8. In the first embodiment, the mark 7 is formed on the surface 42 and is a marking-off line indicating the position of the outer edge of the second tape 9.

In the display device 100, as described above, the second tape 9, which is attached to the surface 42 of the back plate 4 and to the FPC board 52 to fix the FPC board 52 to the back plate 4, has the holes 92 through which the first tape 8 is exposed. This configuration allows an inspector for the display device 100 to check whether the first tape 8 is attached to the inside of the through-hole 41 and to the surfaces 42 and 43 of the back plate 4 to protect the FPC board 52 from damage.

In the display device 100, the two holes 92 are provided, and the two holes 92 are disposed at positions at which the holes 92 can expose the both edges 81 of the first tape 8 in the Y-direction. This configuration allows the inspector to check the position of the first tape 8 in addition to checking whether the first tape 8 is attached.

In the display device 100, the distance PD between the closest perimeter portions of the two holes 92 is less than the width 8W of the first tape 8. This configuration allows the holes 92 to expose the edges 81 of the first tape 8.

In the display device 100, the distance AD between the furthest perimeter portions of the two holes 92 is greater than the width 8W of the first tape 8. This configuration allows the holes 92 to expose the edges 81 of the first tape 8.

In the display device 100, since the mark 7 is formed on the surface 42 of the back plate 4, the second tape 9 can be attached along the mark 7 and thus the inspector can check the edges 81 of the first tape 8 in the Y-direction through the two holes 92.

While an exemplary embodiment has been described, the present disclosure is not limited to the embodiment. The contents disclosed in the embodiment above are given for illustrative purposes only, and various modifications may be made without departing from the spirit of the present disclosure. Modifications made as appropriate without departing from the spirit of the present disclosure naturally fall within the technical scope of the present disclosure. For example, the electronic apparatus according to the embodiment above is not limited to the display device 100 and may be other electronic apparatuses. The display unit 10 is not limited to the one described in the embodiment above. The display unit 10 may be a display panel including an emissive component such as an organic light emitting diode (OLED), or an electrophoretic display.

Other operational advantages accruing from the aspects described in the present embodiment that are obvious from the description herein, or that are conceivable as appropriate by those skilled in the art will naturally be understood as accruing from the present disclosure.

What is claimed is:

1. A display device comprising:
   a plate member disposed on a back-surface side of a display unit;
   a printed circuit board disposed on a back-surface side of the plate member;
   a flexible printed circuit board that is inserted in a through-hole passing through the plate member and electrically couples the display unit to the printed circuit board;
   a first tape that is attached to an inside of the through-hole and to a portion of the plate member at a periphery of the through-hole and is disposed between the plate member and the flexible printed circuit board; and
   a second tape that is attached to the back-surface side of the plate member and to the flexible printed circuit board to close the through-hole, wherein
   the second tape has a hole through which part of the first tape is exposed.

2. The display device of claim 1, wherein the second tape has two of the holes that are disposed at positions at which the two holes are capable of exposing both edges of the first tape in a width direction of the first tape.

3. The display device of claim 2, wherein a distance between closest perimeter portions of the two holes is less than a width of the first tape.

4. The display device of claim 3, wherein a distance between furthest perimeter portions of the two holes is greater than the width of the first tape.

* * * * *